Figure 1:
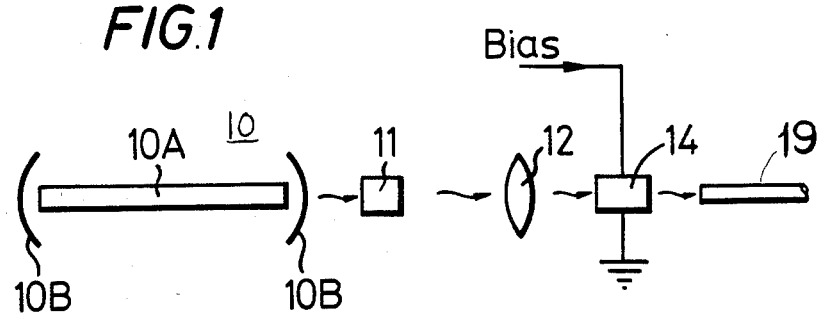

United States Patent [19]

Smith et al.

[11] Patent Number: 4,556,980
[45] Date of Patent: Dec. 3, 1985

[54] LASER LIGHT SOURCES

[75] Inventors: David W. Smith, Woodbridge; Richard Wyatt, Ipswich, both of England

[73] Assignee: British Telecommunications, London, England

[21] Appl. No.: 463,501

[22] Filed: Feb. 3, 1983

[30] Foreign Application Priority Data

Feb. 5, 1982 [GB] United Kingdom ............... 8203314

[51] Int. Cl.$^4$ ............................................. H01S 3/10
[52] U.S. Cl. ..................................... 372/28; 372/18; 372/20; 372/29; 372/70
[58] Field of Search ...................... 372/26, 28, 29, 32, 372/703, 97, 18–20

[56] References Cited

U.S. PATENT DOCUMENTS 3,999,146 12/1976 Lang et al. ......................... 372/26

OTHER PUBLICATIONS

Abramov et al., "Use of a Servoconductor Laser Diode as a Modulator of Gas Laser Radiation"; *Sov. Jour. of Quant. Electronics,* vol. 2, No. 3, Sep.–Oct. '72.
Reinhart; "Reverse-Biased Gallium Phosphide Diodes as High Frequency Light Modulators"; *J. Appl. Phys.* vol. 39, No. 7, pp. 3426–3434, Jun. 1968.
Paoli et al.; "Optical Pulses from CW GaAs Injection Lasers"; *Appl. Phys. Lett.* vol. 15, No. 3, 1 Aug. '69.
"Improvements in Intensity Fluctuation Noise of a 1 Gbit/s-Modulated InGaAsP Laser by a Light Injection Technique" Yamada, Jap. J. of App. Physics, vol. 19, No. 11, Nov. 1980, pp. L689–L692.
"Modulated Single-Longitudinal Mode Semiconductor Laser and Fiber Transmission Characteristics at 1.55 μm", Yamada, IEEE J. of Quantum Electronics, vol. QE-17, No. 6, Jun. 1981.
"Single Mode Operation of 500 Mbit/s Modulated Al-GaAs Semiconductor Laser by Injection Locking", S. Kobayashi et al., Electronics Letters, Sep. 11, 1980, vol. 16, No. 19.
"Receiver Performance Evaluation of Various Digital Optical Modulation-Demodulation Systems in the 0.5–10 μm Wavelength Region", Yamamoto, IEEE Journal of Quantum Electronics, vol. QE-16, No. 11, Nov. 1980, pp. 1251–1259.
"Megahertz Linewidth from A 1–5 μm Semiconductor Laser with HeNe Laser Injection", Wyatt, R., 8030 Electronics Letter, vol. 18, No. 7, Apr. 1982.

*Primary Examiner*—William L. Sikes
*Assistant Examiner*—Léon Scott, Jr.
*Attorney, Agent, or Firm*—Cushman, Darby & Cushman

[57] ABSTRACT

A light source comprises a semiconductor laser and a gas laser. The semiconductor laser is injection locked using the highly coherent output from the gas laser. The output from the semiconductor laser has a narrow linewidth and a high stability.

The invention has a major application in optical fibre communications systems.

19 Claims, 3 Drawing Figures

LASER LIGHT SOURCES

This invention relates to laser light sources, and in particular to injection locked laser light sources.

This application is related to copending commonly assigned U.S. patent application Ser. No. 347,058 filed Feb. 8, 1982 naming Malyon et al as inventors.

The invention has an important application in the field of optical fibre communication systems.

Considerable efforts have been made heretofore to provide, especially for optical fibre communications systems, laser light sources which operate in a single longitudinal mode and which have a narrow line width and high frequency stability.

It has been proposed to provide a single longitudinal mode semiconductor laser light source comprising two semiconductor lasers which are so arranged that light from a semiconductor master laser is injected into a semiconductor slave laser in order to enhance a particular selected mode of the semiconductor slave laser. Provided the two semiconductor lasers are suitably controlled, the optical output of the slave laser is a single longitudinal mode. (See eg, "Improvement in Intensity Fluctuation Noise of a 1 Gbit/s—Modulated InGaAsP Laser by a Light Injection Technique" J. Yamada et al, Japanese Journal of Applied Physics, Vol. 19, No. 11, November 1980, pp L689–L692; "Modulated Single—Longitudinal Mode Semiconductor Laser and Fibre Tranmission Characteristics at 1.55 um", J. Yamada et al., IEEE Journal of Quantum Electronics VOL QE-17, No 6, June 1981; French Pat. No. 2306551 in the name of Licentia Patentverwaltungs GmbH; "Single Mode Operation of 500 Mbit/s Modulated AlGaAs Semiconductor Laser by Injection Locking". S Kobayashi et al, Electronics Letters, Sept. 11, 1980, Vol 16, No 19; U.S. Pat. No. 3,999,146, assigned to Nippon Electric Company Limited, Tokyo, Japan). Whether operated at a wavelengths in the region of 850 nm, or between 1.3 and 1.5 um, it has not been possible until now to produce an injection locked laser light source of this type which is suitable for coherent optical communications systems because the linewidth of these sources is still too broad. Linewidths of the locked mode have often been found to be not significantly lower than those produced by each semiconductor laser alone. In particular, measurements have shown single mode linewidths in the 100 MHz to 1 GHz region, while for coherent PSK (phase shift key) and FSK (frequency shift key) systems linewidths of at least two orders of magnitude lower, ideally in the sub-mega hertz region, are required.

The principles and characteristics of operation of coherent optical communications systems have been described previously (eg, "Receiver Performance Evaluation of Various Digital Optical Modulation-Demodulation Systems in the 0.5–10 um Wavelength Region" by Y Yamamoto, IEEE Journal of Quantum Electronics, Vol QE-16, No 11, November 1980, pp 1251–1259, and further articles referenced therein).

Coherent optical communications systems offer well known benefits over direct intensity modulation systems, but especially so at wavelengths in the 1.5 um region, where direct detection optical receivers offer generally poor performance. Coherent detection is substantially more sensitive so that the benefits can be fully exploited of the long transmitter-receiver spacings which are made possible by the low loss optical fibres which are available for the wavelength region of 1.5 um.

The present invention aims to provide a laser light source with a narrow line width.

The present invention also aims to provide a method of operating a laser light source to obtain a narrow linewidth light output.

The present invention is based on the appreciation that a significantly reduced linewidth can be obtained from a semiconductor slave laser by using a gas master laser.

The linewidth of the semiconductor laser can be made sufficiently narrow in this way for coherent optical communication.

Thus, according to one aspect of the present invention there is provided a light source comprising a first, or master laser, a second, or slave laser arranged such that light from the master laser can be injected into the slave laser to stimulate the slave laser, and means for controlling the master and slave lasers such that the output of the source is a single longitudinal mode, wherein the master laser is a gas laser and the slave laser is a semiconductor laser.

The gas laser is preferably a helium-neon laser which is arranged to operate at approximately 1.5 um. The helium-neon laser may have a quantum limited linewidth of the order of 1 Hz and may be controlled to obtain long term stability of better than 1 MHz.

The semiconductor laser may, for example, be a buried crescent laser.

The semiconductor laser preferably has a single transverse mode, and may have single or multi longitudinal mode behaviour under normal operating conditions.

According to another aspect of the present invention there is provided a method of operating a light source to provide a single longitudinal mode light output which comprises providing two lasers, a first of which is a gas laser, and the second of which is a semiconductor laser, and arranging said lasers such that light from the first laser is injected into the second laser to stimulate the second laser.

A feature of the light source in accordance with the present invention is a light output having a linewidth of the order of 1.5 MHz or less. Such a linewidth is considerably narrower than has been possible in the past.

Modulation of the light source is conveniently achieved by applying a modulating signal to the slave laser in a conventional manner.

Alternatively, the output of the laser light source may be modulated in separate modulating means. This may be interposed, for example, between the master laser and the slave laser.

More than one slave laser may be injection locked to the same master laser.

When more than one slave laser is locked to the same master laser, some or each of the slave laser outputs may be arranged to be offset in frequency by a predetermined amount from the other slave laser or the other slave lasers. Means to achieve the frequency offset may be interposed between the master laser and the slave laser. Such means may comprise, for example, acousto-optic frequency shifters, which are commercially available.

Figure 2A:
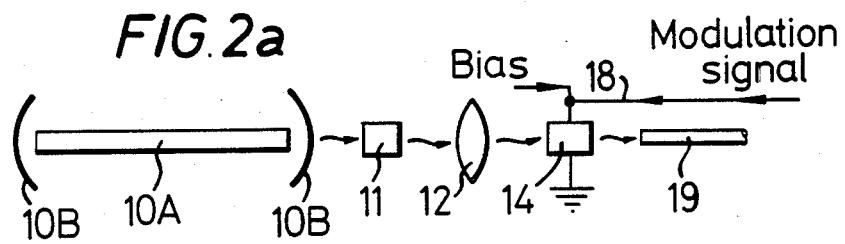
Figure 2B:
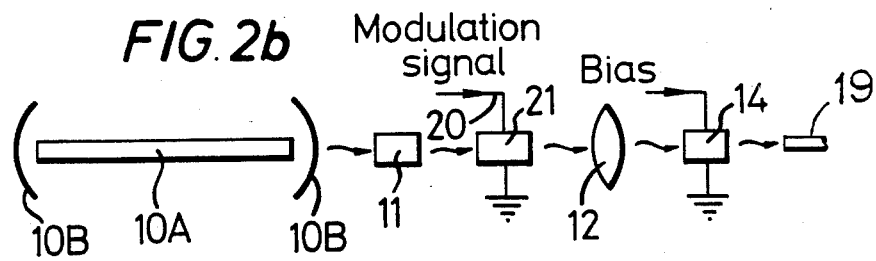

The invention will now be described by way of example only with particular reference to the accompanying drawings, of which:

FIG. 1 is a schematic diagram illustrating a light source in accordance with the present invention, and FIGS. 2a and 2b illustrate two applications of the use of a light source in accordance with the present invention.

The present light source which is illustrated schematically in FIG. 1 of the drawings comprises a helium neon gas master laser 10 having a He-Ne tube 10a and external mirrors 10b, which is arranged so that light emitted thereby can be injected via an optical isolator 11 and lens 12 into a semiconductor slave laser 14. The helium neon laser 10 is a commercial external mirror laser modified for low power narrow linewidth operation at 1.523 um and which gives two 15 uW output beams. The linewidth of the helium neon laser is below 1.5 MHz. The optical isolator 11, such as a magneto-optic isolator, serves to alleviate potential instability problems due to feedback.

The semiconductor laser 14 is a buried crescent laser having a single transverse mode and multi longitudinal mode behaviour under normal operating conditions. The laser 14 is mounted in a DIL (dual in line) package with a butt jointed monomode fibre tail to one facet and a beam collimating microlens to the other facet. For initial experiments the light from the He-Ne laser 10 was injected into the semiconductor laser 12 via the fibre tail and the light output of the semiconductor laser was parallel light output from the microlens. The bias control for the semiconductor laser 14 can include a peltier cooling element to control the package temperature.

In operation of the source, the semiconductor laser 14 is injection locked by light from the helium neon laser 10. The light output from the source which is constituted by the light from the semiconductor laser 14 is a beam having a wavelength of 1.5 um, the output linewidth being reduced to below 1.5 MHz. This reduction in the linewidth results from the injection into the semiconductor laser cavity of a small amount of the narrow band 1.523 um radiation from the helium neon laser. The helium neon laser can be stabilised to the centre of the gain profile giving long term stability of better than 1 MHz.

Measurements carried out on the laser mode spectrum show that more than 85% of the semiconductor laser output is concentrated into the mode at 1.523 um with injection. Laser drive current of the semiconductor laser 12 had to be maintained to within ±0.5 mA of optimum to achieve locking indicating a locking bandwidth of 1 GHz. Measurements of the output from the semiconductor laser 12 under injection locked conditions show a measured linewidth of approximately 1.5 MHz and less. Later measurements, at increased output powers of the gas laser 10 of up to 200 uW and using heterodyne detection with a further He-Ne laser, showed FWHM (full width half maximum) linewidth of less than 30 KHz, for the injection locked semiconductor laser 14, and appeared to be limited by mechanical and accoustic disturbances to the He-Ne Laser 10. Without injection the mode linewidth is measured to be in excess of 1 GHz. Thus injection locking the semiconductor laser 14 using the helium neon laser 10 improves the phase coherence of the semiconductor laser 14 by more than two orders of magnitude.

The control circuitry for controlling the laser 10 and the laser 14 is not shown in detail in FIG. 1. Such circuitry will be apparent to those skilled in the art.

Two applications of the present source are illustrated in FIGS. 2a and 2b. FIG. 2a illustrates the present source used in an amplitude modulation and amplitude shift keying arrangement. In this arrangement a modulation signal is applied to the semiconductor laser 14 by way of a line 18. This modulation appears in the output from the slave laser 14 of the laser source which can be launched into a fibre 19.

FIG. 2b shows the application of the present source to a phase modulation and a phase shift keying arrangement. In this arrangement the modulation signal is applied via a line 20 to a known modulation device 21 located in the optical path between the helium neon laser 10 and the semiconductor laser 14.

It will be appreciated that gas lasers have generally been considered unsuitable for use in practical optical fibre transmission systems because of concern about their reliability and useful life time, and the associated costs of maintenance and back-up facilities. However, with the large transmitter receiver spacings for coherent optical communications systems which are attainable with the aid of the present invention, the aforementioned cost for maintenance and back-up facilities becomes acceptable.

It will be appreciated also that a light source according to the present invention is useful not only for communication systems, but will find application, for example, in fibre testing systems, where heterodyne detection offers greatly improved sensitivity for the detection of light back scattered from discontinuities in an optical fibre.

We claim:

1. An injection-locked pair of optical lasers which together provide a coherent light source comprising:
   gas laser means for generating a narrow linewidth first coherent light output,
   semiconductor laser means biased for generating a less-narrow linewidth second coherent light output serving as the coherent output of said light source; and
   injection-locking means for injecting at least a portion of the narrow linewidth first coherent light output into the semiconductor laser means so as to injection-lock the semiconductor laser means into a predetermined mode of lasing operation which stabilizes said second coherent light output at a predetermined wavelength and linewidth.

2. A light source according to claim 1 wherein said gas laser means comprises a helium-neon gas laser.

3. A light source according to claim 1 in which the semiconductor laser means comprises a buried crescent semiconductor laser.

4. A light source according to claim 1 wherein the semiconductor laser means comprises a plurality of semiconductor lasers.

5. A light source according to claim 4 further comprising means to frequency offset at least one of said plurality of semiconductor lasers.

6. A light source according to claim 1 wherein the gas laser means operates at a wavelength in the region of 1.5 $\mu$m.

7. A transmitter for use in a coherent optical fibre communication system, said transmitter comprising:
   gas laser means generating a narrow linewidth first coherent light output,
   semiconductor laser means arranged and biased for generating a less-narrow linewidth second coherent light output serving as the coherent optical output of said transmitter;
   injection-locking means for injecting at least a portion of the narrow linewidth first coherent light output into the semiconductor laser means so as to injection-lock the semiconductor laser into a predetermined mode of lasing operation which stabilizes said second coherent light output at a predetermined wavelength and linewidth; and modulating means for modulating the second coherent light output with a supplied modulation input signal and thereby to generate a modulated light output.

8. A transmitter according to claim 7 wherein said modulating means comprises means to frequency shift key the second coherent light output.

9. A transmitter according to claim 7 wherein said modulating means comprises means to phase shift key the second coherent light output.

10. A transmitter for a coherent optical communication system, which transmitter comprises:

a gas laser light source to generate narrow linewidth laser light, a semiconductor laser light source including at least one semiconductor laser to generate laser light at a semiconductor laser output linewidth, means to inject at least a portion of said narrow linewidth laser light into said semiconductor laser light source, thereby to reduce the semiconductor laser output linewidth, and modulating means to produce a modulated light output from said semiconductor laser light source.

11. A transmitter according to claim 10 wherein said gas laser comprises a Helium-Neon gas laser.

12. A transmitter according to claim 10 wherein said semiconductor laser comprises a buried crescent semiconductor laser.

13. A transmitter according to claim 10 wherein said semiconductor laser comprises a plurality of semiconductor lasers.

14. A transmitter according to claim 13, further comprising means to frequency offset at least one of said plurality of semiconductor lasers.

15. A transmitter according to claims 10, 11, 12, 13 or 14 wherein the gas laser operates at a wavelength in the region of 1.5 $\mu$m.

16. A transmitter according to claim 10 wherein the modulating means include phase shift keying means for phase shift keying the light output from said semiconductor laser.

17. A transmitter according to claim 10 wherein the modulating means comprise frequency shift keying means for frequency shift keying the light output from said semiconductor laser.

18. A coherent optical oscillator for use in a coherent optical communication system, said oscillator comprising:

a first optical oscillator including a gas laser producing a first optical oscillator output;

a second optical oscillator including a semiconductor laser producing a second optical oscillator output; and injection means for injecting at least a part of said first optical output into said second optical oscillator so as to optically couple and injection-lock the operation of the second optical oscillator thereto.

19. A method for controlling the wavelength and linewidth of the coherent light output from a semiconductor laser, said method comprising the steps of:

generating a narrow linewidth first light output at a predetermined wavelength from operation of a gas laser light source, and injecting at least some of said first light output into a semiconductor laser while it is also operating as a coherent lasing light source so as to lock the semiconductor lasing process to the injected coherent light from the gas laser and thus stabilize the wavelength and reduce the linewidth of the coherent light output from the semiconductor laser.

* * * * *